United States Patent
Chandra et al.

(10) Patent No.: US 6,365,225 B1
(45) Date of Patent: *Apr. 2, 2002

(54) COLD WALL REACTOR AND METHOD FOR CHEMICAL VAPOR DEPOSITION OF BULK POLYSILICON

(75) Inventors: Mohan Chandra, Merrimack; Kedar P. Gupta, Hollis; Jonathan A. Talbott, Amherst; Ijaz Jafri, Nashua, all of NH (US); Vishwanath Prasad, East Setauket, NY (US)

(73) Assignee: G.T. Equipment Technologies, Inc., Nashua, NH (US)

(*) Notice: Subject to any disclaimer, the term of this patent is extended or adjusted under 35 U.S.C. 154(b) by 0 days.

This patent is subject to a terminal disclaimer.

(21) Appl. No.: 09/642,735

(22) Filed: Aug. 17, 2000

Related U.S. Application Data

(63) Continuation-in-part of application No. 09/507,711, filed on Feb. 18, 2000, now Pat. No. 6,284,312.
(60) Provisional application No. 60/184,970, filed on Feb. 25, 2000, and provisional application No. 60/120,990, filed on Feb. 19, 1999.

(51) Int. Cl.⁷ .............................. B05D 7/22; C23C 16/24
(52) U.S. Cl. ............. 427/237; 427/255.18; 427/255.27; 427/255.393; 427/314; 423/349
(58) Field of Search .................. 427/237, 255.27, 427/255.28, 255.393, 255.18, 255.17, 314; 423/348, 349, 350

(56) References Cited

U.S. PATENT DOCUMENTS

| | | | |
|---|---|---|---|
| 3,042,492 A | 7/1962 | Thomsen | |
| 3,042,494 A | 7/1962 | Gutsche | |
| 3,146,123 A | 8/1964 | Bischoff | |
| 3,200,009 A | 8/1965 | Rueschel et al. | |
| 4,123,989 A | 11/1978 | Jewett | |
| 4,265,859 A | 5/1981 | Jewett | |
| 4,653,428 A | 3/1987 | Wilson et al. | |
| 4,657,616 A | 4/1987 | Benzing et al. | |
| 4,681,652 A | 7/1987 | Rogers et al. | |
| 4,981,102 A | 1/1991 | Gautreaux et al. | |
| 5,372,792 A | 12/1994 | Mueller et al. | |
| 5,547,717 A | 8/1996 | Scaringella et al. | |
| 5,552,039 A | * 9/1996 | McBrayer, Jr. et al. | ....... 210/90 |
| 6,284,312 B1 | * 9/2001 | Chandra et al. | ............ 427/237 |

* cited by examiner

*Primary Examiner*—Michael Barr
(74) *Attorney, Agent, or Firm*—Vernon C. Maine; Scott J. Asmus

(57) ABSTRACT

A method and apparatus, and product by process, for the production of bulk polysilicon by a chemical vapor deposition process on a removable tube section. A quartz envelope and base plate form a CVD reactor enclosure, with external radiant heaters providing process heat through the wall of the reactor, and with process gas inlet and outlet ports located in the base plate. A tube section, preferably an EFG silicon tube-section, vertically emplaced on the base plate and capped to close the top is used as the reaction chamber. During the CVD process, deposition occurs on the inside surface of the chamber tube, the inner diameter of the deposit layer becoming increasingly smaller as the yield accumulates. In a two tube reactor, a smaller diameter, vertical middle tube is uniformly spaced and supported inside the chamber tube for fall flow of process gas over and under the middle tube so that deposition occurs on the three exposed tube surfaces. A co-axial core tube and heater mounted on the base plate provides yet more deposition surface area, improved thermal gradient in the reaction chamber, and greater thermal efficiency to the process. The full, double sided deposit on the middle tube and exterior deposit on the core tube are unique products of the process.

15 Claims, 6 Drawing Sheets

COLD WALL REACTOR AND METHOD FOR CHEMICAL VAPOR DEPOSITION OF BULK POLYSILICON

CROSS REFERENCE TO RELATED APPLICATIONS

This application claims priority to U.S. application Ser. No. 60/184,970, filed Feb. 25, 2000, and is a continuation in part to U.S. application Ser. No. 09/507,711, filed Feb. 18, 2000, now issued as U.S. Pat. No. 6,284,312, which claims priority to U.S. application. Ser. No, 60/120,990, filed Feb. 19, 1999.

Acknowledgments are due to the National Science Foundation, Small Business Innovation Research Program, Grant No. DMI-9901717.

BACKGROUND OF THE INVENTION

1. Technical Field of the Invention

This invention relates to CVD reactors and to methods for chemical vapor deposition of bulk polysilicon directly onto the walls of the reaction chamber and on tube walls within the chamber. More particularly, it relates to production of bulk polysilicon by a chemical vapor deposition process where a removable thin wall tubular casing is used to construct the reaction chamber within a CVD reactor, and where additional removable middle and core tubes may also be employed; the tube walls providing additional surface area upon which the polysilicon is deposited, external and core heat sources providing a flatter thermal gradient and improved thermal efficiency.

2. Background Art

One of the widely practiced conventional methods of polysilicon production is by depositing polysilicon in a chemical vapor deposition (CVD) reactor, and is referred to as Siemens method. In this method, polysilicon is deposited in a CVD reactor on high-purity thin silicon rods called "slim rods". Because of the high purity silicon from which these slim rods are fabricated, the corresponding electrical resistance of the slim rods is extremely high. Thus it is extremely difficult to heat this silicon "filament" using electric current, during the startup phase of the process.

Sometimes the slim rods are replaced by metallic rods that are more conductive and easier to heat with electrical current. This method is referred to as Rogers Heitz method. However, the introduction of metal into the chemical vapor deposition process introduces metal contamination. This contamination of the polysilicon yield is not acceptable in the semiconductor/microelectronics industry.

In the Siemens method, external heaters are used to raise the temperature of these high purity rods to approximately 400° C. (centigrade) in order to reduce their electrical resisitivity. Sometimes external heating is applied in form of halogen heating or plasma discharge heating. However in a typical method, to accelerate the heating process, a very high voltage, in the order of thousands of volts, is applied to the rods. Under the very high voltage, a small current starts to flow in the slim rods. This initial flowing current generates heat in the slim rods, reducing the electrical resistance of the rods and permitting yet higher current flow and more heat.

This process of sending low current at high voltage continues until the temperature of slim rods reaches about 800° C. At this temperature, the resistance of the high purity silicon rods falls very drastically and the high voltage source is switched to a low voltage source that is capable of supplying high current.

Referring to prior art FIG. 1, a CVD reactor consists of a base plate 23, quartz bell jar 17, chamber cover 24, bell jar supports 16, and heater 18 between the bell jar and the chamber cover. There is incorporated in base plate 23, a gas inlet 20 and a gas outlet 21, and electrical feedthroughs 19. A viewing port 22 provides for visual inspection of the interior.

In the prior art polysilicon manufacturing process by CVD, the silicon slim rod structure is assembled in the form of a hair pin by having a cross rod 2 placed horizontally on two long, spaced apart, vertical rods 1 and 3. The structure is mounted and connected so as to provide a current path between electrical feedthroughs 19, generating the heat necessary for deposition to occur. During the CVD process, polysilicon deposit accumulates uniformly on the slim rods; the deposit being shown here partially removed to show the slim rod structure. Deposits of silicon on the reactor walls can occur if they become hot enough, so cooling of the reactor walls is sometimes employed to prevent this.

Different users employ different methods for joining the horizontal rod to the vertical rods. One method requires a groove or a key slot at the top of each vertical rod. A small counter bore or conforming fitment is formed on the ends of the horizontal rod so that it can be press fitted into the grooves to bridge the two vertical rods.

A typical prior art reactor consists of a complex array of subsystems. Two power sources are required, one power supply that can provide very high voltages and low current; and a second power supply that can sustain a very high current at relatively lower voltage. Also needed are the slim rod heaters and their corresponding power supply for preheating the slim rods. Another component is the high voltage switch gear. Moreover, the entire startup process is cumbersome and time consuming. Since the current drawn by the slim rods at around 800° C. is of a run away nature, the switching of the high voltage to low voltage needs to be done with extreme care and caution.

Also, through this electric current method for heating the slim rods, the rods become an interior heat source losing tremendous amounts of heat via radiation to the surroundings. There is significant energy loss inherent in the existing practice.

There is a plethora of prior art in the general area of reactors used for chemical vapor deposition, some employing intentional deposition on heated reactor walls. For example, Jewett's U.S. Pat. No. 4,265,859 is a system for producing molten polycrystalline silicon and replenishing the melt of a crystal growth crucible. The system includes a hot wall, muffle furnace reactor in which silicon is deposited in low density form on the wall and inner tube of the reaction chamber by delivering a gaseous silicon compound through the heated chamber, at nominally 1000 degrees Centigrade. After a certain amount of silicon has been deposited on the fused quartz chamber walls and inner tube of the reactor, the chamber temperature is raised higher, to about 1450 degrees Centigrade, to melt down the silicon deposit for recovery, letting it run molten out the bottom of the reactor into the melt crucible of the crystal growth part of the system. When the heat is reduced in the outflow trap, a silicon plug forms, re-sealing the reactor for the next cycle. This gas inflow/molten silicon outflow reactor operation is repeated cyclically without cooling or opening the reactor between cycles, to support the crystal growth operation. The hot quartz chamber wall of the Jewett reactor requires a fully encircling support, disclosed as graphite, to sustain wall integrity at high temperature. It is not used or useful for the production of bulk polysilicon ingots.

Gautreaux et al's U.S. Pat. No. 4,981,102 discloses a hot wall CVD muffle furnace reactor with a heated liner for collecting silicon deposits on the inner face, from a through-flow of silicon gas. The reactor can be cycled to high heat to melt the silicon for molten outflow, or opened via a large door on the reactor to remove the liner so that the deposited silicon can be removed from the inside surface of the liner for use as bulk ingots of polycrystalline silicon. The liner is disclosed to be a removable unitary or assemblage of liner components, fabricated or coated with molybdenum, graphite, silicon, silicon nitride or other materials. It is not known to be in commercial practice.

Jewett's U.S. Pat. No. 4,123,989 discloses a horizontal muffle furnace and method for producing silicon by CVD on the inside of a silicon tube emplaced horizontally in the through-flow furnace so as to define the reaction chamber. The silicon tube is reportedly supported on its sidewall within the muffle tube by graphite support rings, and sealed or at least supported securely for alignment at both ends to cooling head end caps through which the process materials are flowed. Water is circulated through the cooling heads to prevent deposition on the cooling heads. A muffle tube of quartz or other high temperature, non-contaminating material surrounds the silicon tube. The space between the muffle tube and the silicon tube may be held at an overpressure state with argon to assure no out gassing from the silicon tube chamber. A resistance heater system surrounds the muffle tube, and the assemblage is insulated from without. Jewett describes the thin wall silicon tube as a product of EFG (Edge-defined Film fed Growth) process.

There are inherent problems and limitations with the Jewett disclosure, published in November, 1978. It is inherently a single tube, through-flow, deposition process. Assembly is complex, with water cooled end caps, plumbing and alignment issues. Adequate support for the horizontally oriented, thin wall tube at high temperature is very difficult to achieve, without farther altering heat distribution and deposition patterns with more support rings. To the Applicant's knowledge, the device has never been placed in commercial service. Further, no production method in use commercially is known to the Applicant to employ external heat to a reactor as the primary source of heat for CVD of bulk polysilicon.

Examples of tubular wall reactors for the cyclic deposition and melting of silicon include Tokuyama Corp's JP8259211, issued Oct. 8, 1996, disclosing a decomposition/reduction reactor for silanes and production of crystalline silicon; and Wacker Chemitronic's DE4127819, a reactor using a silicon tube heated by direct conduction of an electric current for deposition and melting of the silicon.

Other patents are more clearly distinguished but may provide some additional context to the general field of reactive vessels and processes. Massey et al's EP0164928, is a vertical hot wall CVD reactor for thin film deposition on substrates, utilizing a bell jar on a platform envelope within the furnace. Gas inlet and exhaust manifolds extending upward from the base plate and having ports spaced along their length, combined with the geometry of the substrate carrier assembly, provide generally separate, virgin gas flow patterns across each of the stacked substrates. This device is not designed, used for, or obviously adaptable to the production of bulk polysilicon. McBrayer, Jr., et al's U.S. Pat. No. 5,552,039 is a turbulent flow, cold-wall reactor for supercritical water processes combined with corrosive atmospheres, using a bell jar/base plate design with a vertical core feeding tube extending into the reaction zone.

SUMMARY OF THE INVENTION

The broad goal of the invention is to introduce improvements in the means for generating ingots of polysilicon by a chemical vapor deposition (CVD) process. The most common carrier gas for chemical vapor deposition of polysilicon is hydrogen, although an inert gas could be used. Suitable reactant materials for use with a hydrogen carrier are either silane, $SiH_4$, having a deposition temperature in the order of 800 degrees centigrade, or any of the chlorosilanes, which have a deposition temperature in the order of 1000 to 1200 degrees, depending on the actual composition and process details. The gaseous byproducts of the CVD process reactor are removed continuously through outlet ports of the reactor, as new carrier gas and reactant materials are admitted through inlet ports into the reactor. The supply, reclamation and recycling of process materials outside the reactor is outside the scope of this disclosure.

It is an object of the invention to provide an apparatus and method for more efficient production of polysilicon by chemical vapor deposition, using less power and resulting in lower cost, by using a consumable, removable, thin wall tubular casing to construct a one time use, vertically oriented reaction chamber within a cold wall reactor envelope, heating the reaction chamber radiantly from outside the envelop of the reactor, flowing and counter flowing silicon ladened gas in the reaction chamber, and depositing polysilicon directly upon the interior wall of the tubular casing.

In accordance with the invention, a cold wall chemical vapor deposition reactor is specifically designed to utilize a reaction chamber constructed from a consumable, replaceable component of the system, a section of tubular material, which may be of silicon, graphite or suitable metals and is preferably an EFG thin wall silicon tube. The chamber tube is supported on a base support, preferably graphite. The chamber and base support are closed at bottom and top ends as may be done with a base plate and cover plate respectively. The inner surface of the tube becomes the wall of the reaction chamber. Slight over pressure may be maintained through the base plate to a blanket zone between the envelope of the reactor and the reaction chamber to protect from outgassing.

When radiant heat is applied from sources external to the chamber sufficient to heat the chamber walls to the necessary deposition temperature, as with jacket heaters applying radiant heat through a cold wall quartz envelope onto the silicon chamber tube, and a select combination of carrier gas and reactant materials containing silicon are admitted into the chamber through the base plate to be flowed and counter-flowed about the chamber and exhausted through the base plate, the hot chamber walls then becoming a broad surface area available for deposition of bulk polysilicon.

As the chemical vapor deposition proceeds, a continuous, broad surface layer of polysilicon is deposited on the chamber wall, building in thickness so that the interior diameter of the chamber grows progressively smaller. This results in the production of a hollow, tubular bulk quantity of polysilicon within a thin wall tubular casing. Upon completion of the deposition cycle, the reactor is disassembled sufficiently far so as to enable the end product, the chamber tube and its deposit, to be removed. A new chamber tube is installed for the next deposition cycle. The tube or casing can be included or removed from the end product prior to further processing of the polysilicon.

Study of flow patterns in the capped vertical chamber show that the flow of process gases between the base plate inlet and outlet extends throughout the chamber to all exposed tube walls, providing flow and counter flow movement in the chamber that assures generally fall and uniform deposition over the length of the chamber, and promotes a more efficient process, generally extracting and depositing more silicon per volume of input gases than comparable through flow reactors.

It is a another object of the invention to increase the initial deposition surface area over that of a basic vertical tube wall deposition chamber. To that end, there is provided a further refinement of the invention, the placement of a consumable, replaceable, somewhat smaller diameter thin wall middle tube, preferably an EFG silicon tube, in the center of the reaction chamber, supported on spaced apart or ventilated graphite supports and not extending fully to the chamber top so as to permit circulation of gases over, under and around the middle tube, so that broad area deposition occurs on both the inner and outer surfaces of the middle tube concurrently with deposition on the inner surface of the shell or chamber tube. This results in a larger yield over the same reaction time, and more efficient use of the reactor. Upon completion of the deposition cycle, the middle tube with its inner and outer deposit layers is likewise harvested as a product of the invention.

It is yet another object of the invention to improve the efficiency of the heating system and reduce the heat losses, relative to the yield of polysilicon. It is a further object of the invention to reduce the temperature gradient from the exterior to the interior of the reactor of the invention so as to promote a greater and more uniform rate of deposit on all available surface area. It is a yet further object to provide more initial surface area for deposition. To these ends, a as different or additional heating element is incorporated into the device and methodology previously described. A co-axial heater configured with an external deposition surface area core tube is placed at the axial center of the primary reaction chamber of a single tube or multi-tube embodiment of the invention, or as a sole deposition surface in a cold wall CVD reactor, extending upwards from the base plate. An elongate radiant heating element is axially positioned and supported within the heater tube, with suitable connections to external sources of power and control through the base plate, and is sealed directly or indirectly from the deposition process.

The process is conducted as previously described, except that heat is preferably applied to the system from the external radiant heater assembly and the core heating element, thereby heating the primary reaction chamber and all deposition surfaces from both sides to a more uniform temperature, resulting in a faster startup and more uniform deposit rate. When the deposition has been carried to the desired extent, the apparatus is deconstructed and the heater tube with its exterior deposit of polysilicon is added to the total yield of the batch. Reloading the reactor will, of course, require a new heater tube assembly or a new tubular deposition cover tube over the heater element.

Still other objectives and advantages of the present invention will become readily apparent to those skilled in this art from the detailed description, wherein we have shown and described a preferred embodiment of the invention, simply by way of illustration of the best mode contemplated by us on carrying out our invention.

DESCRIPTION OF THE PREFERRED EMBODIMENT

The invention is susceptible of many variations. Accordingly, the drawings and following description of the preferred embodiment are to be regarded as illustrative in nature, and not as restrictive.

Figure 2:
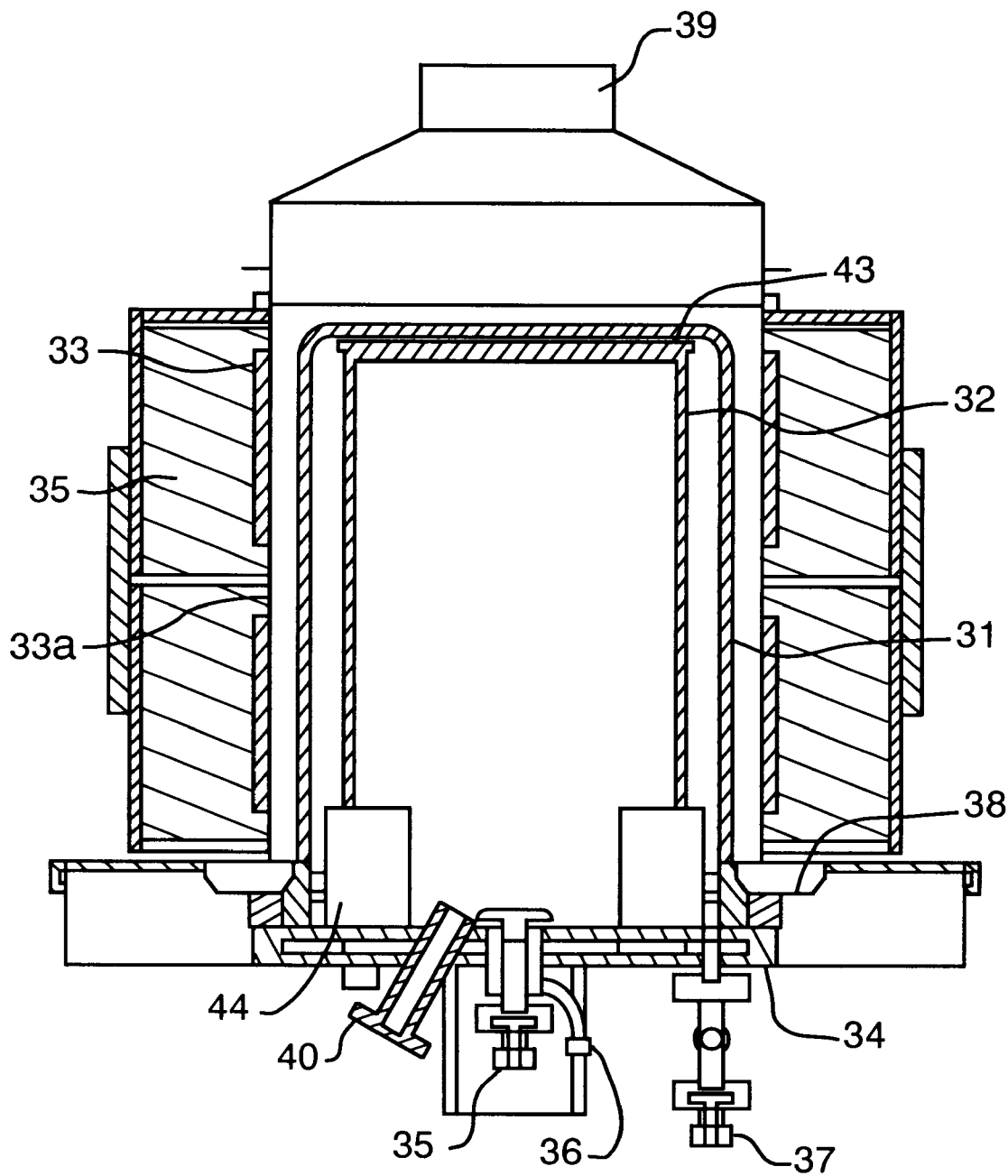
FIG. 2 is a side elevation cross section of a CVD reactor configured with a single silicon tube deposition target for accumulating an interior surface deposit of polysilicon.

The invention employs a novel approach to the application of the Chemical Vapor Deposition (CVD) reactor process for polysilicon production. Referring to FIG. 2, a preferred embodiment of the invention utilizes an external jacket heater assembly 33, with quartz heater cover 33A on the inside face, and outside insulation layer 35. The heater assembly, which can be made from, for example, any refractory metal, is arranged symmetrically around a quartz envelope 31 of the cold wall reactor apparatus. The heater assembly has no contact with the reacting gases. The choice for the design, materials and construction of the heater assembly is dependent on the requirements of providing sufficient inwardly radiated heat to the reactor to maintain adequate temperature on the deposition surface area of a silicon chamber tube within the reactor so that polysilicon deposition can occur, with minimum energy loses due to heat radiated outwardly from the heater assembly.

Within quartz envelope 31 there is a vertically arranged, hollow, EFG drawn silicon chamber tube 32, in this embodiment being 30 centimeters diameter and about one meter tall, which is closed at the top end by a thin graphite cover 43 to form a primary CVD reaction chamber. Although this preferred embodiment utilizes a uniformly circular silicon chamber tube 32, the use of any other tubular shape such as non-uniformly circular, square, rectangular, or octagonal, is within the scope of the invention. The bottom end of chamber tube 32 rests on graphite support 44, and hence on base plate 34, forming the primary reaction chamber.

The system is evacuated and then purged to remove any residual air; then radiant heat is applied by electric heater assembly 33 until chamber tube 32 reaches deposition temperature. Radiant heat penetrates quartz envelope 31 to silicon tube 32. From the outside of chamber tube 32, heat is transferred via conduction through the thin wall of the tube to the inner surface of the silicon tube. Heat conduction through the tube wall happens readily because the starting thickness of the EFG grown tube wall is of the order of 300 to 800 micrometers. The tubular structure can be fabricated by any means and be of material other than silicon, so long as it meets the structural and thermal requirements.

When the inner wall is at deposition temperature, a process gas mixture of carrier gas and reactant materials is piped into the reaction chamber through process gas inlet 35, while carrier gas is admitted through blanket gas inlet 37. The blanket gas is automatically maintained at slightly higher pressure in the blanket zone than within the primary reaction chamber so as to assure there is no outflow leakage of gaseous byproduct from the reaction chamber. During the chemical vapor deposition reaction within tube 32, the gaseous byproducts are evacuated through process gas outlet 36. Study of flow patterns in the chamber show that the flow of process gases between the base plate inlet and outlet extends throughout the chamber to all exposed tube wall, providing flow and counter flow movement that assures generally full and uniform deposition over the full length of the chamber tube, and promotes a more efficient process, extracting and depositing more silicon per volume of input gases than through flow methods.

A cooling gas, in the preferred embodiment being air, is admitted at cooling gas inlet 38 and exhausted at cooling gas outlet 39, during the process, in order to control external temperature of quartz envelope 31. Process viewing port 40 in base plate 34 provides for process monitoring within the reaction chamber.

As deposition starts and continues on the inside of tube 32, the inner diameter of the tube gets smaller and smaller. To compensate for the growing wall thickness, more power is applied to the heating assembly to generate more heat, to maintain the temperature on the inner surface of the silicon deposit at the required value to continue the process.

The apparatus can be alternately constructed and the process conducted so that electrical current is passed through the length of tube 32 itself to generate heat, analogous to the slim rod heating of the prior art. The preferred current path for tube conductance is from electrical connections, not shown, from graphite support 44, current running through silicon tube 32, to graphite cover 43. This mode of heating can be used as a supplement or alternate method of heating the deposit wall surface.

Figure 3:
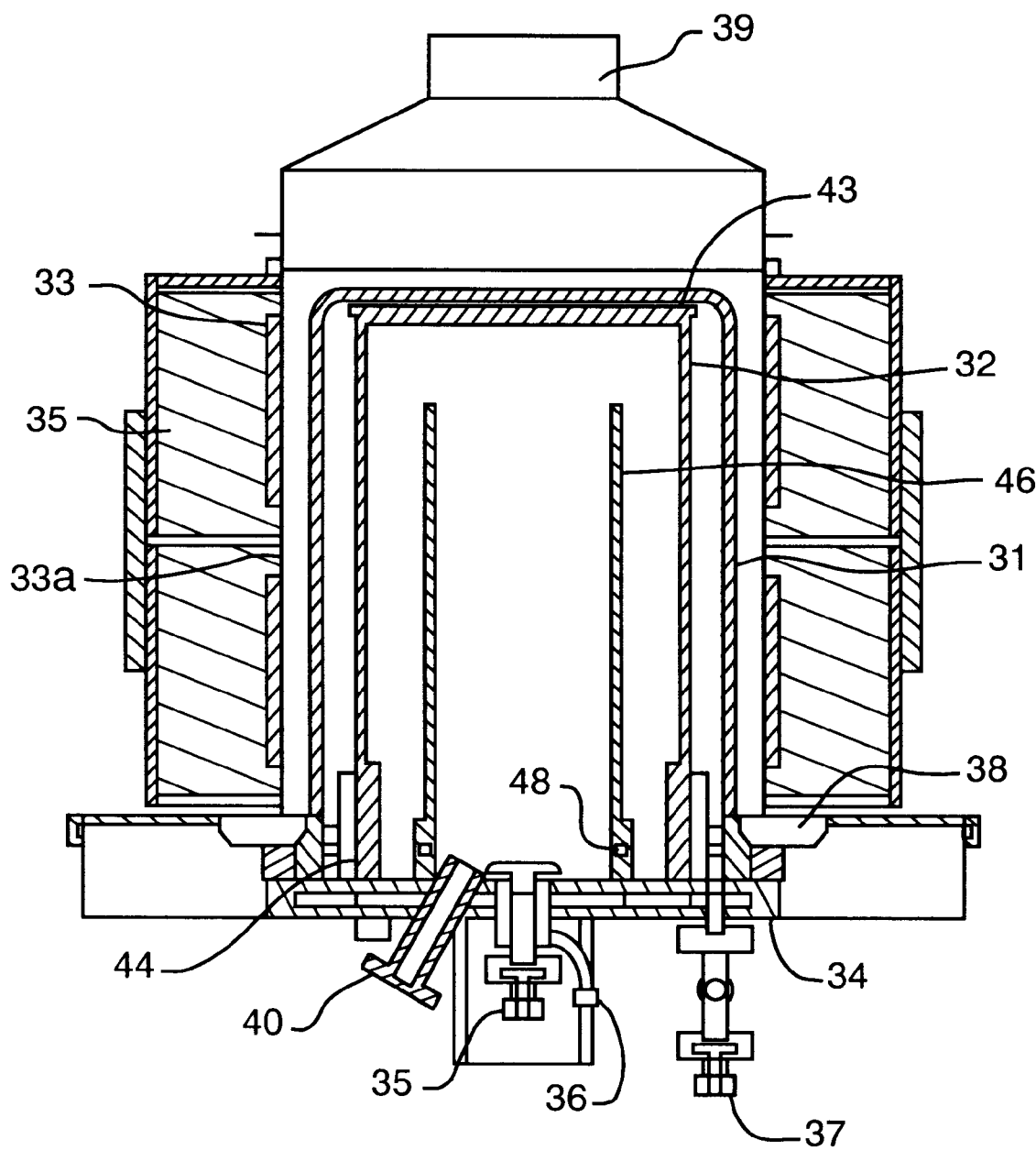
FIG. 3 is a side elevation cross section of the CVD reactor of FIG. 2 configured with two silicon tube deposition targets, a smaller diameter tube for accumulating polysilicon deposits on both interior and exterior surfaces, and a larger diameter tube which as in FIG. 2, for accumulating a polysilicon deposit only on its interior surface.

Referring to FIG. 3, another preferred embodiment of the invention likewise utilizes an external jacket heater assembly 33, with quartz heater cover 33A on the inside face, and outside insulation layer 35. The heater assembly, which can be made from, for example, any refractory metal, is arranged symmetrically around a quartz envelope 31 of the reactor apparatus. The heater assembly has no contact with the reacting gases. The choice for the design, materials and construction of the heater assembly is selected to provide sufficient radiant heat through the cold wall of the reactor to maintain adequate temperature on the inner wall surface of an EFG drawn silicon outer chamber tube, and on the outer and inner wall surfaces of a smaller diameter EFG drawn silicon middle tube centered and supported within the outer tube so as to allow the ready flow of reacting gases to pass over and under the ends of the middle tube, so that polysilicon deposition can occur on all three wall surfaces.

Within quartz envelope 31 there is a vertically arranged, hollow silicon chamber tube 32, in the preferred embodiment being 30 centimeters diameter and about one meter tall, which is closed at the top end by a thin graphite cover 43 to form a primary CVD reaction chamber. The cover can be of material other than graphite, including quartz or silicon. Centered within by chamber tube 32, there is a vertically arranged, hollow, EFG drawn silicon middle tube 46, in this embodiment being 15 centimeters diameter and about 100 centimeters tall. Although this preferred embodiment utilizes a uniformly circular silicon chamber tube 32, the use of any other tubular shape such as non-uniformly circular, square, rectangular, or octagonal, is within the scope of the invention. Tubes formed by other processes may be equally suitable.

The bottom end of chamber tube 32 rests on graphite support 44, and hence on base plate 34. The bottom end of middle tube 46 rests on open graphite supports 48 resting on base plate 34, configured to permit the free flow of reaction gases between the bottom end of the tube and base plate 34. The top end of tube 46 is sufficiently short of cover 43 to likewise permit the free flow of reaction gases between the top end of the tube and the cover.

As in the FIG. 2 embodiment, the system is evacuated and then purged to remove any residual air, and radiant heat is applied by electric heater assembly 33 until chamber tube 32 reaches deposition temperature. Radiant heat penetrates cold wall quartz envelope 31 to chamber tube 32. Heat is transferred via conduction through the thin wall of the chamber tube to the inner surface, and by radiation to middle tube 46. Tubes 32 and 46 can be fabricated of material other than silicon, so long as it meets the structural and thermal requirements.

When both the chamber tube and middle tube walls are at deposition temperature, a process gas mixture of carrier gas and reactant materials is piped into the reaction chamber through process gas inlet 35, while carrier gas is admitted through blanket gas inlet 37. The blanket gas is automatically maintained at slightly higher pressure in the blanket zone than within the primary reaction chamber so as to assure there is no outflow leakage of gaseous by product from the reaction chamber. During the chemical vapor deposition reaction within tube 32, the gaseous byproducts are evacuated through process gas outlet 36. Study of flow patterns in the chamber show that the flow of process gases between the base plate inlet and outlet extends throughout the chamber to all exposed tube walls, providing flow and counter flow movement that assures generally fall and uniform deposition over the length of both tubes, and promotes a more efficient process, extracting and depositing more silicon per volume of input gases than through flow methods.

Again as in the prior embodiment, a cooling gas is admitted at cooling gas inlet 38 and exhausted at cooling gas outlet 39, during the process, in order to control external temperature of quartz envelope 31, hence keeping the cold wall cold. Process viewing port 40 in base plate 34 provides for process monitoring within the reaction chamber.

As in the prior embodiment, as deposition layers grow thicker, more heat must be applied to the reaction chamber to maintain the temperature on the inner diameter middle tube deposit surface at the required deposition temperature, until the desired thickness has been achieved. Each user will need to analyze the chemical species, process time, energy requirements and costs, and yield, in order to optimize its own process cycle.

Again, the FIG. 3 method and apparatus can be constructed and configured so as to utilize an electrical current through chamber tube 32 to generate heat, analogous to the slim rod heating of the prior art. This mode of heating can be used as a supplement or alternate method of heating the deposit wall surface.

Figure 6:
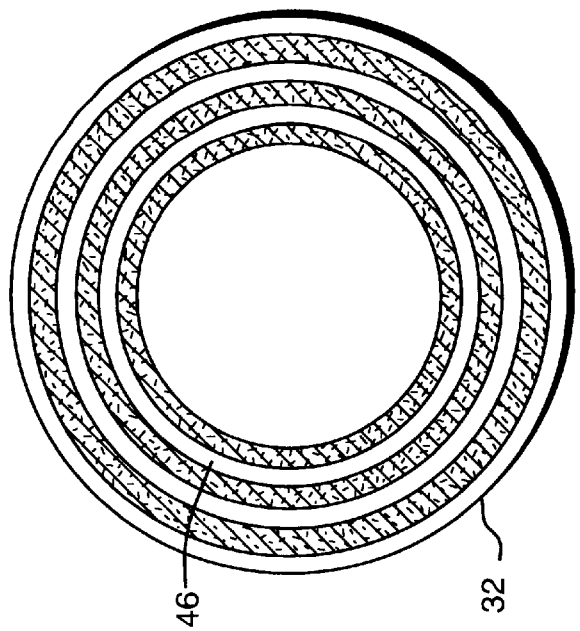
FIG. 6 is a cross section top view of the two tube reactor of FIG. 3, and its post-process accumulated deposits of polysilicon on three surfaces.
Figure 4:
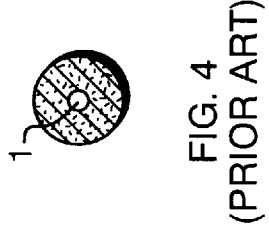
FIG. 4 is a cross section top view of a prior art slim rod and its post-process accumulated deposit of polysilicon.
Figure 5:
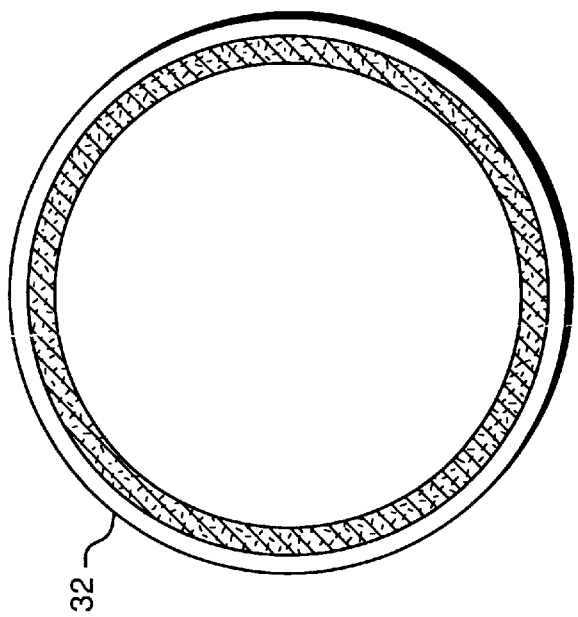
FIG. 5 is a cross section top view of the single tube reactor of FIG. 2, and its post-process accumulated deposit of polysilicon on the interior surface.

Referring to FIGS. 4, 5, and 6, there is shown in cross section the final deposition pattern of polysilicon on the FIG. 4, slim rod 1, of the prior art, and its comparison to the deposition pattern and relatively greater volume of the embodiments of the invention of FIG. 2, tube 32, and FIG. 3, tubes 32 and 46 respectively. It should be noted that in the prior art, multiple slim rods are attached in the hairpin configuration in a large CVD reactor. The reactor sizes are quite big to accommodate anywhere from 6 to 18 rod sets. To simplify the comparison here, a single slim rod is being compared with one meter long tube setups of the preferred embodiments.

Figure 1:
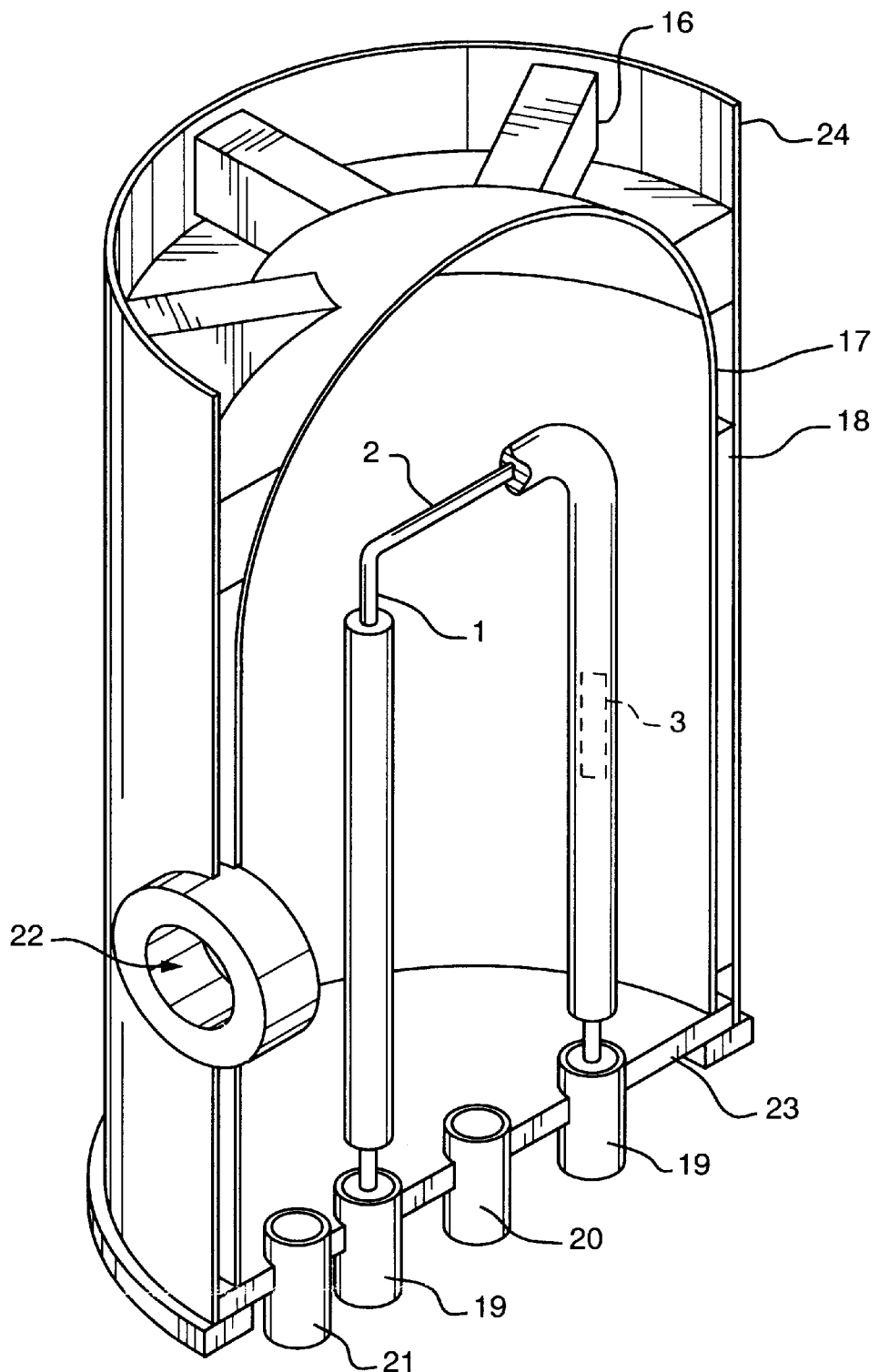
FIG. 1 is a cut-away, perspective view of a prior art CVD reactor for polysilicon deposition with a slim rod in the form of a hair pin.
Figure 7:
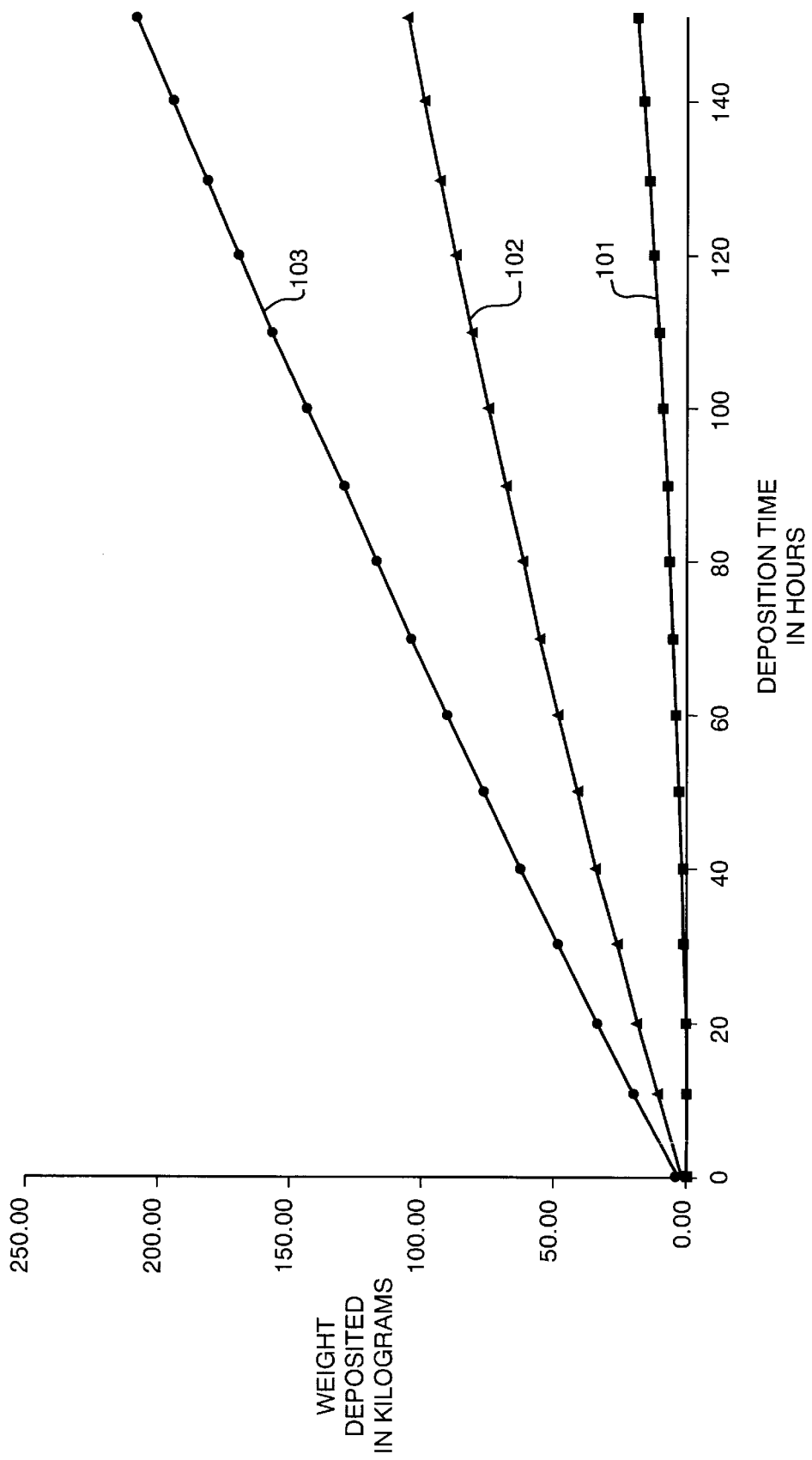
FIG. 7 is a graph depicting the relative weight of deposited polysilicon versus deposition time for the prior art slim rod setup of FIG. 1, the single tube reactor setup of FIG. 2, and the two tube reactor setup of FIG. 3.

Referring to FIG. 7, this three line graph of yield by weight deposited in kilograms of polysilicon versus deposition time in hours, correlates to the performance of the prior art FIG. 1 setup, squares legend line 101, and the embodiments of FIG. 2, triangles legend line 102, and FIG. 3 circles legend line 103. All operating parameters being the same, the deposition rate will be the same for all three cases. For this comparison, the rate of deposition is assumed to be 5 microns/minute. The starting diameter for the FIG. 1 slim rod is seven millimeters; for the FIG. 2 single tube, 300 millimeters; and for the FIG. 3 two tube setup, 300 millimeters and 150 millimeters respectively.

The comparative slope of each line illustrates the relatively greater yield potential of the FIGS. 2 and 3 embodiments of the invention compared to the prior art practice. For a deposition time of about 120 hours, a slim rod is likely to achieve a diameter of about 8–10 cm, and a line 101 yield of 12 kgs. In comparison, the FIG. 2 preferred embodiment single tube weight, line 102, reaches 86 kgs. The FIG. 3 two tube embodiment weight, line 103, for the same deposition time reaches 167 kgs.

Depending on the end use of the polysilicon produced, the outer portion of the FIG. 2 polysilicon tube 32, and the FIG. 3 outer tube 32, after deposition can be ground off or etched off to remove the original tube wall material. This is possible because the starting thickness of the EFG grown tubes is of the order of 300 to 800 micrometers. Removal of the original wall material removes any possible contaminants that may have been present on the tube at the start of the deposition process.

In the case of middle tube 46 with inner and outer deposit layers, the middle tube is inaccessible for removal in this manner. However, since that the weight of the tube is extremely small compared to the end weight of deposited material, the total concentration of contaminants becomes extremely small once the polysilicon material is melted for production of silicon.

Figure 8:
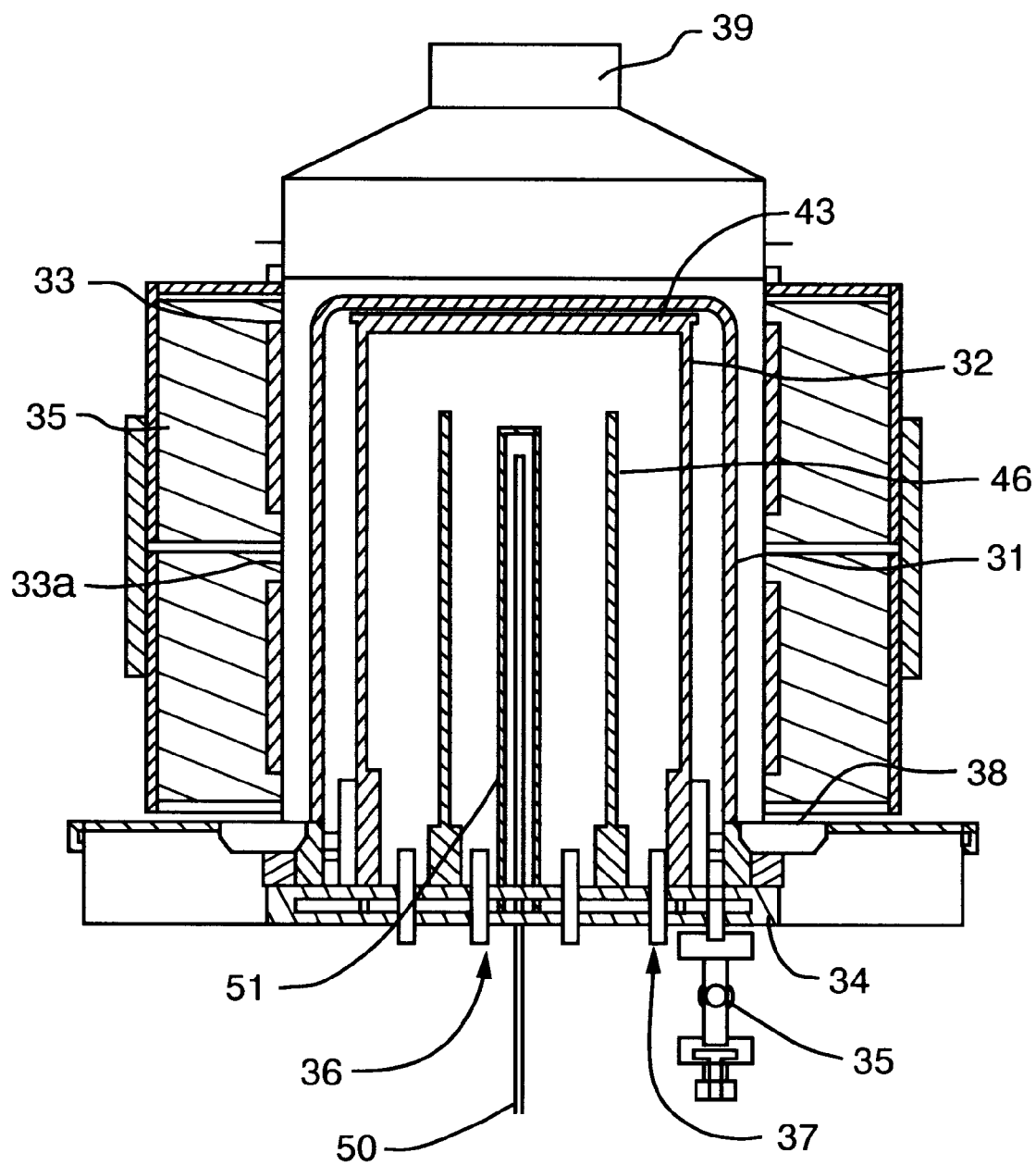
FIG. 8 is a cross section view of a preferred embodiment with a heater tube and core heater, the interior of the heater tube sealed and isolated from the reaction chamber, the external surface of the heater tube being in the reaction chamber and available for deposition.

Referring now to FIG. 8, a further embodiment of the invention extends the embodiment of FIG. 3 to include a small silicon core tube 51 and core heater 50, having an elongate radiant heating element, extending upwards from base plate 34. Power for heater 50 is brought through base plate 34. Core tube 51 is sealed so that heater 50 is isolated from reactant gases. Core tube 51 and core heater 50 may be prefabricated as a unitary part, the heater being disposable. Core heater 50, generating heat from the center of the reaction chamber, in combination with external heaters 33, provides a further gain in the efficiency of the heating system, reducing the amount of heat input relative to the yield of polysilicon. Adding this interior source of heat so as to sandwich the process between heat sources reduces the total temperature gradient from the exterior to the interior of the reaction chamber so as to promote a greater and more uniform rate of deposit on all available surface area. Furthermore, core tube 51 contributes additional surface area for deposition.

The process of FIG. 8 is conducted as previously described, except that heat is applied to the system from both the external radiant heater assembly and the core heating element, thereby heating the reaction chamber and all deposition surfaces from both sides to a more uniform temperature, resulting in a faster startup and more uniform deposit rate. When the deposition has been carried to the desired extent, the apparatus is deconstructed and core tube 51 with its exterior deposit of polysilicon is added to the total yield of the batch. Reloading the reactor will, of course, require a new core tube 51, or core tube/heater assembly.

It will be appreciated by those skilled in the art that the core heater and sealed core heater tube feature of the invention, where the core heater tube is intended to contribute a significant initial area for deposition while shielding the core heater from exposure to the process, is capable of many variations and adaptations. For example, the heater tube may be utilized in conjunction with a chamber tube, with or without a middle tube, and with or without an external heat source. As implied in the previous statement, the simplest embodiment of a core tube and heater implementation within the scope of the invention, while not illustrated specifically in the figures, is clearly understood from what is illustrated and what is hereafter described.

A vertical cold wall reactor may be equipped with means to support a removable and replaceable core tube from either or both ends by suitable base plates, the core tube preferably being an EFG grown silicon tube, but tubes of other materials and processes may be used. One or both support places are equipped with requisite inlet and outlet ports for admission and recovery of process gases and byproducts. A core heater is configured for emplacement within the core tube in a closely conforming fit to the interior wall, and the assemblage mounted to one or both base plates with connections to an external power source for the heater. The core tube may be of any diameter sufficiently large to accommodate a suitable heater, but it will be appreciated that the invention contemplates that a larger diameter tube provides more initial surface area for deposition, so long as space for adequate depth of deposition is provided in the reactor. The heater, being electrically isolated from the tube, is more easily controlled for heat output than is a traditional slim rod using direct current heating, not conducive of a runaway condition.

Further, the reactor remains insulated generally to conserve system energy input, but the wall of the reactor needs to be cooled with cooling air, by reference to temperature sensors in appropriate places, to a sufficient degree to avoid unwanted deposition on the reactor envelope. While this embodiment offers clear benefits over the prior art, it will be quickly appreciated that the addition of a replaceable chamber tube and external heaters radiating through the cold wall quartz envelope as described, providing both a chamber wall and a core tube deposition surface, with improved temperature gradient across the process chamber and a generally less critical, higher yield per batch process, is a commercially important enhancement. Adding the middle tube, with its over and under through flow for uniform distribution of the deposition process adding two more surfaces for deposition, realizes even greater benefits. The number and placement of process gas inlet and outlet ports can be selected to optimize flow patterns for the specific orientation of deposition tubes.

Conceptually one might add more co-axial middle tube sections of sequentially different diameters, each contributing two more deposition surfaces. However, the larger chamber diameter, or decreasing spacing between tubes, the tube size inventory, and the heat control and temperature gradient problem, pose practical limitations to this concept.

The core tube and heater assembly is base mounted and vertically ascending into the reaction chamber, or may be designed and constructed so as to pierce the primary reaction chamber at both ends like the hole in a donut, permitting more flexibility in the selection, installation, and supply of power to the core heater. The heater tube is preferably made of silicon or may be made of other suitable materials, as may the other deposition surfaces. The heating element may be an electrical heating element or any other type of heat radiator capable of generating the required output in a similar form factor. The heater may be sealed with respect to the heater tube, or the tube with respect to the reaction chamber, so as to insure in any case that the heater element is isolated from direct contact with the process. The core heater may or may not be disposable, being replaced with the core heater tube for each cycle.

In summary, the methods and devices of the invention as described above, illustrated, and claimed below, have many advantages over the prior art. No preheating of the deposition tube is required in order to reduce the electrical resistance, as with carrier rods or slim rods. There is no requirement for the associated high voltage source and the high voltage switchgear. The tube within a tube configuration provides more initial deposition surface area per volume of reaction chamber than any other method in commercial practice. There is no special wall support requirement other than base support for the vertically oriented chamber tube and middle tube. The flow and counter flow of gases in the reaction chamber provides more efficient extraction of silicon from the process. The two to four tube surfaces available for deposition provide a greater yield of polysilicon per deposition cycle than any slim rod process. The core heater option provides even quicker startup, shorter cycle time, better thermal efficiency, and greater yields.

In the commercial practice of slim rod deposition, there is very little control on radiation losses within the reactor. This increases the energy required per kilogram of silicon yield, considerably. This invention suppresses the radiation loss considerably since there are no watercooled jackets used to remove radiated heat. Since the heating is initiated from the outside of the reactor, and optionally from a core heater, there is little radiation loss to water-cooled walls since apart from the base plate, there are none. In the commercial practice of slim rod deposition, this heat loss can be as much as ninety percent (90%).

In slim rod deposition, because of the need to produce a high yield on a per batch basis, multiple slim rod structures are used in each batch. This makes the reactors very expensive. There is also a possibility of slim rods touching and fusing together because of the high currents required to maintain the temperature. With the present invention, this phenomenon does not occur because there is no special need to pass current through the silicon tube itself.

As will be realized, the invention is capable of other and different embodiments and its several details are capable of modifications in various obvious respects, all without departing from the essence of the invention.

To those skilled in the art, the invention admits of many variations. For example, there is within the scope of the invention a method and apparatus for the production of bulk polysilicon by chemical vapor deposition consisting of the components and steps of:

(1) using a cold wall quartz envelope reactor on a horizontal reactor base plate having an inlet port and an outlet port, where the ports communicate with the interior of the envelope, and are connectable at the underside of the base plate to exterior sources and recovery systems of the inflowing process gas and outflowing byproducts, (2) vertically emplacing within the envelope a thin wall chamber tube, such as an EFG tube section, and closing the top end of said chamber tube so as to form a reaction chamber with which the inlet port and outlet ports are communicating, (3) using a radiant heat source for raising to and maintaining the interior surface of the chamber tube at the deposition temperature of a select combination of carrier gas and silicon reactant materials, (4) flowing a carrier gas ladened with silicon reactant materials through the gas inlet port or ports into the reaction chamber to initiate and support a chemical vapor deposition process, (5) flowing the gaseous byproducts of the process out of the reaction chamber through the outlet port or ports, and (6) disassembling the reactor so as to recover the chamber tube with its solidified deposition layer of polysilicon.

Variations on this and other embodiments of the invention may include the radiant heat source being a radiant heater assembly arranged and operated external of the quartz envelope reactor so as to radiant heat inward towards the reaction chamber. There may be a core heater and sealed core heater tube support system in the center of the base plate, where the support system includes connections for hooking external power to the core heater, where the method includes vertically emplacing on the base plate a core heater sealed in a core heater tube.

Further variations on this and other embodiments of the invention may include using a system with a middle tube support system on the base plate, where the middle tube support system is of smaller diameter than and centered within the outer tube support system, and is ventilated for through flow of gas, such as by being segmented or using spaced apart support blocks, and where the method includes the further steps of: vertically emplacing on the middle tube support system a thin wall middle tube such as an EFG silicon tube section, where the middle tube is of smaller diameter than the chamber tube and extends vertically upward to less than the height of the top end of the chamber tube so that there is room for ready circulation of process gases between inside and outside of the middle tube; and applying sufficient heat to the reaction chamber so as to raise to and maintain the interior and exterior surfaces of the middle tube at the deposition temperature of the selected combination of carrier gas and silicon reactant materials.

Yet further variations on this and other embodiments of the invention have the carrier gas being hydrogen and the silicon reactant material being silane, or the carrier gas being hydrogen and the silicon reactant material being a chlorosilane. In all cases, the chamber tube, and the middle tube and core tube where included, may be an elongate tube of uniform diameter and made of silicon, such as an EFG silicon tube section.

Additional variations on this and other embodiments of the invention may have a blanket zone between the reactor envelope and the reaction chamber, and a blanket gas port in the base plate communicating with the blanket zone, where the method includes the steps of admitting a blanket gas through the blanket gas port into the blanket gas zone, and maintaining a positive pressure differential between the blanket gas zone and the reaction chamber. In all cases using external radiant heaters, the reactor used may be configured for flowing cooling air between the external radiant heater assembly and the reactor envelope.

As yet another example, there two products uniquely within the scope of the invention by virtue of having necessarily been made by the methods and apparatus of the invention: a bulk deposit of polysilicon applied by a chemical vapor deposition process on the exterior surface of a tube section, such as is achieved on a core tube as described above; and a bulk deposit of polysilicon which is the sum of the deposits applied by a chemical vapor deposition process on both the exterior and interior surfaces of a tube section, such as is achieved on a middle tube as described above. The products may be produced on tube sections fabricated of silicon, or on tubes of such other material as is compatible with the process.

As will be realized, the invention is capable of other and different embodiments, and its several details are capable of modifications in various obvious respects, all without departing from the invention.

We claim:

1. A method for production of bulk polysilicon by a chemical vapor deposition process comprising the steps of:

using a vertical wall, quartz, chemical vapor deposition reactor envelope mountable on a horizontal reactor base plate, said base plate having an inlet port and an outlet port, each said port communicating with the interior of said envelope, vertically emplacing within said envelope on said base plate a chamber tube so as to be communicating with said inlet port and said outlet port, closing the top end of said chamber tube so as to form a reaction chamber, using a radiant heat source for raising to and maintaining the interior surface of said chamber tube including any deposit layer thereon at the deposition temperature of a select combination of carrier gas and silicon reactant materials, flowing said carrier gas ladened with said silicon reactant materials into said reaction chamber through said gas inlet port and flowing gaseous byproducts of said chemical vapor deposition process out of said reaction chamber through said outlet port so as to deposit silicon on said interior surface of said chamber tube, removing said chamber tube with said deposit layer thereon from said reactor envelope.

2. A method for producing polysilicon according to claim 1, said radiant heat source comprising a radiant heater assembly external of said reactor envelope.

3. A method for producing polysilicon according to claim 2, said radiant heat source further comprising a core heater and sealed core heater tube support system in the center of said base plate, said support system including means for connecting external power to said core heater, said method comprising, prior to said flowing steps, the step of vertically emplacing on said base plate a said core heater sealed in a core heater tube.

4. A method for producing polysilicon according to claim 1, further comprising using a middle tube support system on said base plate, said middle tube support system being of smaller diameter than and centered within said chamber tube and being ventilated for through flow of gas, said method comprising the further steps of:

vertically emplacing on said middle tube support system a middle tube, said middle tube being of smaller diameter than said chamber tube and extending vertically upward to less than the height of said top end of said chamber tube, and applying sufficient heat to said reaction chamber so as to raise to and maintain the interior and exterior surfaces of said middle tube including any deposit layer thereon at the deposition temperature of said select combination of carrier gas and silicon reactant materials.

5. A method for producing polysilicon according to claim 1, said carrier gas being hydrogen, said silicon reactant material being silane.

6. A method for producing polysilicon according to claim 1, said carrier gas being hydrogen, said silicon reactant material being a chlorosilane.

7. A method for producing polysilicon according to claim 1, said chamber tube being an elongate tube of uniform diameter and made of silicon.

8. A method for producing polysilicon according to claim 3, said core heater tube being an elongate tube of uniform diameter and made of silicon.

9. A method for producing polysilicon according to claim 4, said middle tube being an elongate tube of uniform diameter and made of silicon.

10. A method for producing polysilicon according to claim 1, further comprising using a blanket zone between said reactor envelope and said reaction chamber, and a blanket gas port in said base plate communicating with said blanket zone, said method further comprising the steps of:

admitting a blanket gas through said blanket gas port into said blanket gas zone, maintaining a positive pressure differential between said blanket gas zone and said reaction chamber.

11. A method for producing polysilicon according to claim 10, further comprising flowing cooling air between said radiant heat source and said reactor envelope.

12. A method for production of bulk polysilicon by a chemical vapor deposition process comprising the steps of:

using a vertical wall, quartz, chemical vapor deposition reactor envelope mountable on a horizontal reactor base plate, said base plate having an inlet port and an outlet port, each said port communicating with the interior of said envelope, vertically emplacing within said envelope on said base plate an elongate, silicon chamber tube of uniform diameter so as to be communicating with said inlet port and said outlet port, closing the top end of said chamber tube so as to form a reaction chamber, using a radiant heater assembly external of said reactor envelope in combination with a core heater in a vertically oriented and sealed core heater tube extending upward from the center of said base plate for raising to and maintaining the interior surface of said chamber tube including any deposit layer thereon at the deposition temperature of a select combination of carrier gas and silicon reactant materials, said base plate including means for connecting external power to said core heater, flowing said carrier gas ladened with said silicon reactant materials into said reaction chamber through said gas inlet port and flowing gaseous byproducts of said chemical vapor deposition process out of said reaction chamber through said outlet port so as to deposit silicon layers on said interior surface of said chamber tube and on the exterior surface of said core heater tube, said carrier gas being hydrogen and said silicon reactant material being chosen from the group consisting of silane and chlorosilane, removing said chamber tube and said core heater tube with said deposit layers thereon from said reactor envelope.

13. A method for producing polysilicon according to claim 12 further comprising the step of using a middle tube support system on said base plate, said middle tube support system being of smaller diameter than and centered within said chamber tube, being of larger diameter than and centered about said core heater tube, and being ventilated for through flow of gas, said method comprising the further steps of:

vertically emplacing on said middle tube support system an elongate, silicon middle tube, said middle tube extending vertically upward to less than the height of said top end of said chamber tube, and applying sufficient heat to said reaction chamber so as to raise to and maintain the interior and exterior surfaces of said middle tube including any deposit layers thereon at the deposition temperature of said select combination of carrier gas and silicon reactant materials.

14. A method for production of bulk polysilicon by a chemical vapor deposition process comprising the steps of:

using a vertical wall, quartz, chemical vapor deposition reactor envelope mountable on a horizontal reactor base plate, said base plate having an inlet port and an outlet port, each said port communicating with the interior of said envelope, vertically emplacing within said envelope on said base plate an elongate, silicon chamber tube of uniform diameter so as to be communicating with said inlet port and said outlet port, using a middle tube support system on said base plate, said middle tube support system being of smaller diameter than and centered within said chamber tube and being ventilated for through flow of gas, vertically emplacing on said middle tube support system an elongate, silicon middle tube, said middle tube being of smaller diameter than said chamber tube and extending vertically upward to less than the height of said top end of said chamber tube, closing the top end of said chamber tube so as to form a reaction chamber, using a radiant heat source assembly external of said reactor envelope for raising to and maintaining the interior surface of said chamber tube and the interior and exterior surfaces of said middle tube including any deposit layers thereon at the deposition temperature of a select combination of carrier gas and silicon reactant materials, wherein said carrier gas is hydrogen and said silicon reactant material is chosen from the group consisting of silane and chlorosilane, and flowing said carrier gas ladened with said silicon reactant materials into said reaction chamber through said gas inlet port and flowing gaseous byproducts of said chemical vapor deposition process out of said reaction chamber trough said outlet port so as to deposit silicon on said interior surface of said chamber tube, removing said chamber tube and said middle tube with said deposit layers thereon from said reactor envelope.

15. A method for producing polysilicon according to claim 14, said method comprising the further step of:

using a core heater and sealed core heater tube support system extending upward from the center of said base plate within said middle tube in combination with said radiant heat source external of said envelope, said base plate including means for connecting external power to said core heater.

* * * * *